United States Patent [19]
Galvin

[11] 3,986,478
[45] Oct. 19, 1976

[54] VAPOR DEPOSITION APPARATUS INCLUDING ORBITAL SUBSTRATE HOLDER

[75] Inventor: Lee R. Galvin, Scottsdale, Ariz.

[73] Assignee: Motorola, Inc., Chicago, Ill.

[22] Filed: Feb. 9, 1976

[21] Appl. No.: 656,236

Related U.S. Application Data

[62] Division of Ser. No. 577,807, May 15, 1975.

[52] U.S. Cl. ............................ 118/49; 118/53; 269/57
[51] Int. Cl.² ............................................ C23C 13/08
[58] Field of Search ........................ 118/48–49.5, 118/500, 503, 53; 269/57; 427/248 G, 251

[56] References Cited
UNITED STATES PATENTS

| | | | |
|---|---|---|---|
| 2,351,537 | 6/1944 | Osterberg et al. | 118/49 |
| 2,483,443 | 10/1949 | Spence | 118/53 UX |
| 2,824,029 | 2/1958 | Zinty | 118/53 UX |
| 2,997,979 | 8/1961 | Tassara | 118/49 |
| 3,046,157 | 7/1962 | Nyman | 118/53 UX |
| 3,643,625 | 2/1972 | Mahl | 118/48 |
| 3,746,571 | 7/1973 | Little, Jr. | 118/79.1 X |
| 3,858,547 | 1/1975 | Bergfelt | 118/49 |
| 3,889,632 | 6/1975 | Brunner et al. | 118/49.1 |

*Primary Examiner*—Morris Kaplan
*Attorney, Agent, or Firm*—Eugene A. Parsons; Sang Ki Lee; Harry M. Weiss

[57] ABSTRACT

In a method of an apparatus for forming a conductive layer on a substrate wafer by evaporative, sputtering or other similar processes performed under a controlled environment, there are provided means for holding the wafer at the edge portions thereof with minimal holding contact, means orbiting rotating the wafer about a first axis which forms an acute angle relative to the major surfaces of the wafer while the processes for forming the layer is in progress so that the layer is formed uniformly, and means orbiting the wafer about a second axis which is substantially orthogonal to said first axis.

2 Claims, 6 Drawing Figures

VAPOR DEPOSITION APPARATUS INCLUDING ORBITAL SUBSTRATE HOLDER

This is a division of application Ser. No. 577,807, filed May 15, 1975.

FIELD OF THE INVENTION

This invention relates to an apparatus for forming a conductive layer on a substrate wafer and, more particularly, to an improved method of and apparatus for, forming a conductive layer or sequential continuous layers on a substrate wafer by evaporative, sputtering or other similar processes whereby, a conductive layer is formed uniformly on the exposed surfaces, of the wafer at the same time.

BACKGROUND OF THE INVENTION

With the microwave integrated circuits coming of age there is a growing need for metallization on two major surfaces of the substrates which may typically be made of ceramic material. In addition, there is a need for metallization of the edges and via hole surfaces for certain purposes such as connection of electrically common major surfaces. Conventional sputtering or evaporating processes are found to be incapable of providing continuous metal film on two or more major surfaces, via holes and the edges in a single pump down cycle.

SUMMARY OF THE INVENTION

It is an object of the present invention to provide an improved apparatus for forming conductive layer on a substrate wafer by evaporative, sputtering or other similar processes that can form the layer uniformly on all of the major surfaces, via holes and the edges of the wafer at the same time.

The aforementioned and other objects of the present invention is achieved in accordance with the present invention by an improved apparatus whereby the conventional evaporative, sputtering or other similar processes are enhanced to include the steps of holding the wafer at the edge portions thereof with minimum of contact with the wafer necessary to hold the wafer in position and rotating the wafer about a first axis which forms an acute angle relative to the major surfaces of the wafer while the processes for forming the layer is in progress so that the layer is formed uniformly on all of the exposed surfaces of the wafer at the same time.

In accordance with a feature of the present invention, the apparatus is provided with additional means for rotating the wafer about a second axis which is substantially orthogonal to said first axis.

In accordance with still another feature of the present invention, there is provided an apparatus for implementing evaporative, sputtering or other similar processes which is provided with further means for holding the wafer at selected locations of the edges with a minimum amount of contact as is necessary to hold the wafer in position and means for rotating the wafer about a first axis which forms an angle with respect to the major surfaces of the wafer and means for enabling the rotating means to rotate the wafer while the process for forming the layer is in progress, so that the layer is formed uniformly on all of the exposed surfaces of the wafer at the same time.

The aforementioned and other objects and features of the present invention will be made clearer from the following detailed description of an illustrative embodiment in conjunction with the accompanying drawings.

DETAILED DESCRIPTION OF THE INVENTION

Figure 1:
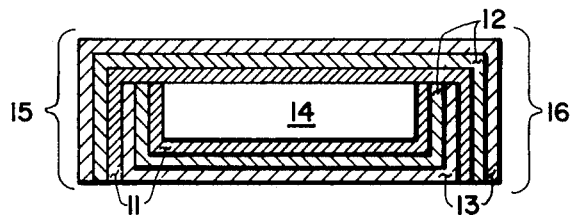
FIG. 1 shows a cross section of a wafer with various metal layers formed on the wafer in a conventional two cycle process.

A conventional evaporative or sputtering equipment is designed to deposit a metal layer on one major surface of a batch of substrates during a pump-down cycle. Consequently, conventional equipment requires two pump-down cycles, or two deposition cycles, to metallize two major surfaces of a wafer. During each pump-down cycle, the process forms a plurality of metal layers, as illustrated in FIG. 1, such as titanium layer 11, molybdenum layer 12 and gold layer 13, on one major surface of a substate 14, such as silicon, while the remaining or the other major surface is not exposed to the process cycles. The pump-down cycle is repeated for the other or remaining unexposed surface. However, the edges and any holes that may be provided are subject to both cycles. Consequently, the edge portions, 15 and 16 of the substrate 14, are exposed twice, that is, they are exposed to each of the two deposition cycles. So two overlapping layers of each of the materials are formed on the edges of the substrate, as illustrated in FIG. 1 during the deposition or pump-down cycle.

Since ordinarily, most thin film forming processes entail two or more sequential depositing processes of two or more different materials, as illustrated above, the resulting products have the overlapped double layer edges. The double layers are undesirable from the standpoint of etching the edge wrap pattern; they also introduce undesirable interdiffusion side effect between two metals that are normally separated by a barrier metal layer, such as the molybdenum, in the above example.

Figure 2:
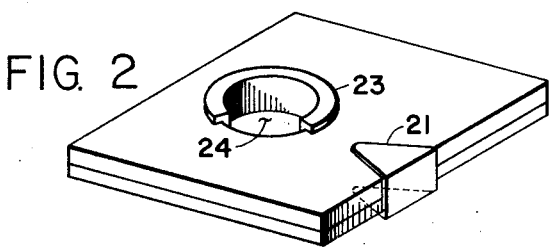
FIG. 2 illustrates a perspective view of an edge metallized section useful to provide ground potential to the circuitry from one wafer to another.

In fact, in certain applications where it is desirable to form an edge wrap 21 or thorugh wrap 23 via an aperture or hole 24 (FIG. 2) of a conductive path made of the conductive material, such as gold, the double layers present difficulties, if not almost impossible task of etching away unwanted areas; this is because the intermetallic barrier layer 12, made of such material as molybdenum, interferes with desired etching processes. Because of these difficulties, hole walls filled with a conducting medium have been the only recourse with previous systems, and available techniques were relatively expensive. For example, it has been known to drill holes through the wafer and filing the holes with metal to provide the conductive path from one major to the opposite major surface. Metallizing the holes with conventional techniques is usually a high cost process.

Figure 3:
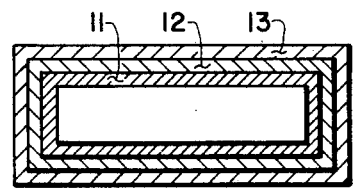
FIG. 3 shows a cross section of a wafer and metal layers resulting from the present inventive method.
Figure 4:
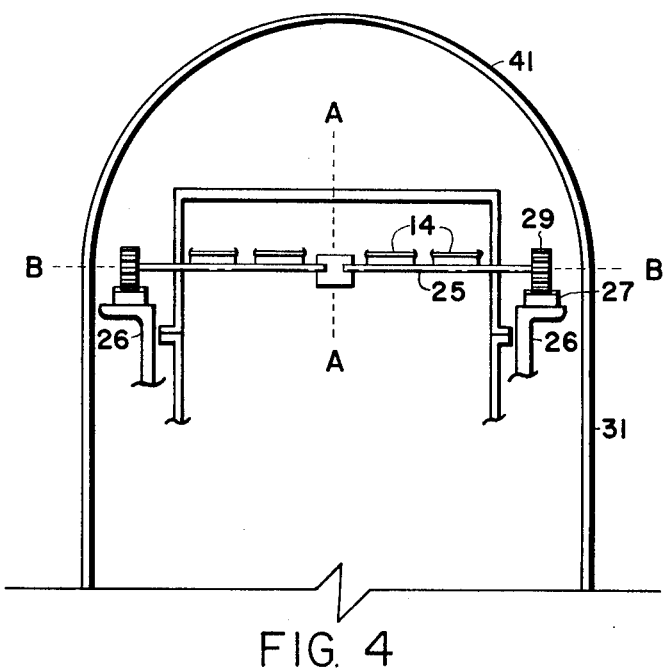
FIG. 4 shows in a schematic side view of a thin film evaporator apparatus that includes means for holding and spinning the wafer in accordance with the present invention.
Figure 5:
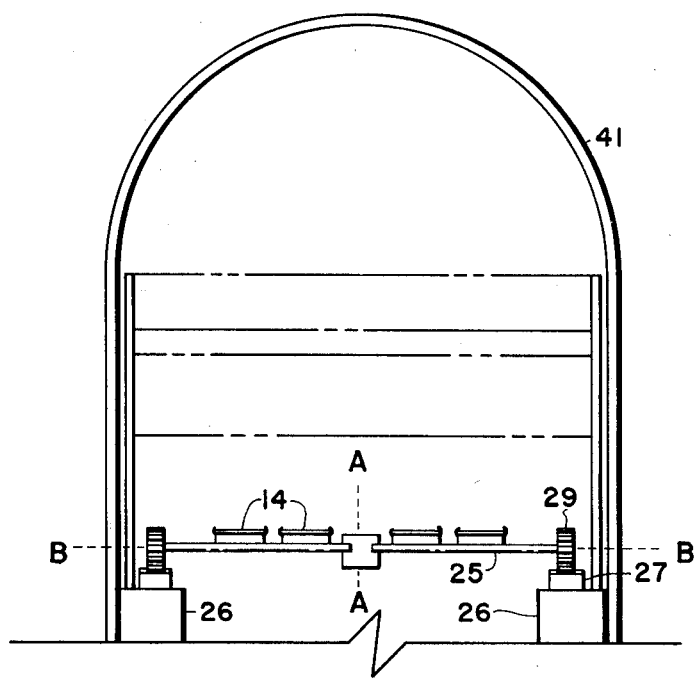
FIG. 5 shows schematic side view of a thin film sputtering equipment having a rotatable platform on which the substrate to be worked on is mounted in accordance with the present invention.

In accordance with the present invention, the aforementioned shortcomings and problems are obviated entirely by performing the layer forming processes for all the exposed surfaces at the same time in a single deposition cycle or layer forming process cycle whereby overlapped double layer system is entirely avoided (See FIG. 3). To implement this process, the conventional evaporating or sputtering equipment, respectively illustrated in FIGS. 4 and 5, are provided with accessories which are designed to hold selected portions of the edges with the minimum amount of contact therewith and spin the substrate during the deposition or layer forming processes. The spinning operation may be performed about an axis AA which may be a vertical relative to the major surface plane, as illustrated in conjunction with FIGS. 4 and 5 and about another axis BB which may be orthogonical thereto, e.g., horizontal axis BB using any suitable conventional means as illustrated in FIGS. 4 and 5 or both.

Each of the wafers 14 may be held on at their edges by suitable clipping means 32 mounted on a spinner shaft 25 radially extending out relative to the vertical axis AA. For either sputtering or evaporative processes, a plurality of radially disposed spinner shafts, each with a number of substrate wafers mounted thereon in the aforementioned manner. The number of the shafts can be optimized for a given substrate size and equipment dimensions. The spinner shafts may be driven by a rotating platform 26 having a stationary ring gear drive mechanism 27 which drives pinion gears 29 mounted at the end of each shaft, as illustrated in FIGS. 4 and 5.

Figure 6:
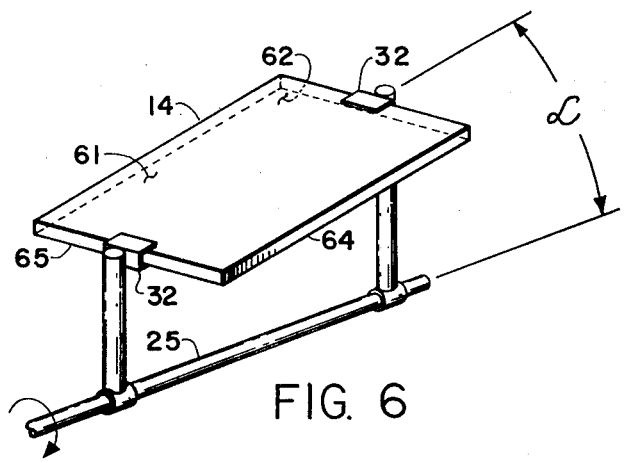
FIG. 6 shows an example of how the wafer may be mounted.

Preferably, the wafers may be held at the edge portions thereof so that all the major surfaces of the wafer as well as the edges are constantly and uniformly exposed to the evaporative or sputtering or other layer forming influences. FIG. 6 illustrates an example of the manner in which the wafer may be mounted to the spinner shaft 25 to expose the major surfaces 61 and 62 and the edges 64 and 65 uniformly to the evaporative, sputtering processes or the similar layer forming processes taking place within the housing.

Preferably the slant given to the wafer is at an angle α with respect to the spinner shaft 25 such that both the major surfaces and the edges of the wafer 14 form about 45° to the major direction of sputtering or evaporation action taking place within the jar 41. This will tend to expose the major as well as the edge surfaces uniformly to layer forming materials.

By spinning the substrates during the layer forming processes the principle or major surfaces and the edges are coated with uniform and continuous metal layers during a single pump-down cycle. The spinner shaft may be made of a small diameter wire so that the shadow of the spinner shaft that treverses across on major surface of the substrate wafer has a negligible effect on the thickness of the deposition made on that side.

While the present inventive processes and apparatus are illustrated in terms of evaporative or sputtering processes, clearly they are not intended to be so limited. Various changes and modifications of the present invention will be apparent to one of the ordinary skill without departing from the spirit and scope of the teachings of the present invention described above.

What is claimed is:
1. In apparatus for vapor depositing on substrate wafers disposed in a vacuum chamber and operatively associated with a said vapor source therein, the improvement comprising:
   a rotatable, unitary structure comprising a plurality of horizontally disposed, rotatable shafts, extending radially in a common plane;
   at least a pair of spaced, operatively associated arm elements mounted on, and extending normal to and in unequal lengths, each said shaft;
   a pair of relatively small, substrate holder clamps mounted on the free ends of each said pair of arms, whereby a said substrate wafer may be supported at minimal edge areas and spaced from, and with the major surfaces thereof at a predetermined angle to the associated horizontally disposed rotatable shaft; and
   means rotating each of said unitary structure and rotatable shafts;
   whereby said shafts and substrates orbit the vertical axis of said unitary structure and each said substrate further orbits its associated rotating shaft.
2. In apparatus as in claim 1, wherein siad shafts are of relatively minimal diameter whereby to inhibit shadow formation of deposit.

\* \* \* \* \*